US008866551B2

(12) United States Patent
Lam et al.

(10) Patent No.: US 8,866,551 B2
(45) Date of Patent: Oct. 21, 2014

(54) IMPEDANCE COMPENSATION FOR OPERATIONAL AMPLIFIERS USED IN VARIABLE ENVIRONMENTS

(75) Inventors: Cuon Lam, Renton, WA (US); Jay Kuehny, Sammamish, WA (US); David Perchlik, Redmond, WA (US)

(73) Assignee: Crane Electronics, Inc., Redmond, WA (US)

( * ) Notice: Subject to any disclaimer, the term of this patent is extended or adjusted under 35 U.S.C. 154(b) by 53 days.

(21) Appl. No.: 13/609,107

(22) Filed: Sep. 10, 2012

(65) Prior Publication Data

US 2014/0070887 A1 Mar. 13, 2014

(51) Int. Cl.
*H03F 3/45* (2006.01)
(52) U.S. Cl.
CPC .................................... *H03F 3/45* (2013.01)
USPC ......................... 330/256; 330/289; 330/308
(58) Field of Classification Search
CPC .............................. H03F 2200/468; H03F 3/45
USPC ........................ 330/69, 256, 266, 289, 308
See application file for complete search history.

(56) References Cited

U.S. PATENT DOCUMENTS

| | | | |
|---|---|---|---|
| 4,128,868 A | 12/1978 | Gamble | |
| 4,635,002 A | 1/1987 | Riebeek | |
| 4,743,835 A | 5/1988 | Bossé et al. | |
| 4,992,919 A | 2/1991 | Lee et al. | |
| 5,148,357 A | 9/1992 | Paice | |
| 5,418,502 A | 5/1995 | Ma et al. | |
| 5,430,640 A | 7/1995 | Lee | |
| 5,481,225 A | 1/1996 | Lumsden et al. | |
| 5,521,807 A | 5/1996 | Chen et al. | |
| 5,631,822 A | 5/1997 | Silberkleit et al. | |
| 5,638,262 A | 6/1997 | Brown | |
| 5,694,303 A | 12/1997 | Silberkleit et al. | |
| 5,774,347 A | 6/1998 | Nakanishi | |
| 5,903,504 A | 5/1999 | Chevallier et al. | |

(Continued)

FOREIGN PATENT DOCUMENTS

| | | |
|---|---|---|
| CN | 103582997 A | 2/2014 |
| JP | 2001-320250 A | 11/2001 |

(Continued)

OTHER PUBLICATIONS

Nguyen et al., "Nulling Input Offset Voltage of Operational Amplifiers," Mixed Signal Products, Texas Instruments—Application Report SLOA045, Aug. 2000, pp. 1-15.

(Continued)

*Primary Examiner* — Robert Pascal
*Assistant Examiner* — Khiem Nguyen
(74) *Attorney, Agent, or Firm* — Seed IP Law Group PLLC

(57) ABSTRACT

A dual compensation operational amplifier is suitable for use in an environment that experiences fluctuations in ambient energy levels. A dual compensation impedance can be determined to nullify or compensate for effects of an input offset voltage or an input bias current or both. Adjustments to the dual compensation impedance can be made based on calibration data for various environmental conditions so that the dual compensation impedance can be either pre-set for anticipated conditions in different target operational environments, or automatically adjusted in-situ. Target operational environments that may benefit from such a dual compensation impedance include remote areas that experience extreme or variable temperatures, high altitudes, space, or high radiation environments.

24 Claims, 11 Drawing Sheets

(56) References Cited

U.S. PATENT DOCUMENTS

| | | |
|---|---|---|
| 6,043,705 A | 3/2000 | Jiang |
| 6,137,373 A | 10/2000 | Mori |
| 6,157,180 A | 12/2000 | Kuo |
| 6,335,872 B1 | 1/2002 | Zhou et al. |
| 6,343,026 B1 | 1/2002 | Perry |
| 6,456,511 B1 | 9/2002 | Wong |
| 6,472,852 B1 | 10/2002 | Lethellier |
| 6,545,534 B1 | 4/2003 | Mehr |
| 6,643,151 B1 | 11/2003 | Nebrigic et al. |
| 6,697,955 B1 | 2/2004 | Malik et al. |
| 6,998,901 B2 | 2/2006 | Lee |
| 7,061,212 B2 | 6/2006 | Phadke |
| 7,183,727 B2 | 2/2007 | Ferguson et al. |
| 7,206,210 B2 | 4/2007 | Harnett et al. |
| 7,286,376 B2 | 10/2007 | Yang |
| 7,339,804 B2 | 3/2008 | Uchida |
| 7,515,005 B2 | 4/2009 | Dan |
| 7,564,706 B1 | 7/2009 | Herbert |
| 7,577,539 B2 * | 8/2009 | Hubanks et al. .............. 702/104 |
| 7,579,901 B2 | 8/2009 | Yamashita |
| 7,602,273 B2 * | 10/2009 | Yoshikawa ................ 338/22 SD |
| 7,730,981 B2 | 6/2010 | McCabe et al. |
| 7,742,318 B2 | 6/2010 | Fu et al. |
| 7,847,519 B2 | 12/2010 | Ho |
| 7,884,317 B2 | 2/2011 | Casper |
| 8,040,699 B2 | 10/2011 | Huynh et al. |
| 8,067,992 B2 | 11/2011 | Chen et al. |
| 8,358,118 B2 | 1/2013 | Chen et al. |
| 8,520,415 B1 | 8/2013 | Krishnamoorthy et al. |
| 8,552,589 B2 | 10/2013 | Ghosh et al. |
| 8,649,128 B2 | 2/2014 | Wang et al. |
| 2002/0015320 A1 | 2/2002 | Mochikawa et al. |
| 2002/0071300 A1 | 6/2002 | Jang et al. |
| 2004/0125523 A1 | 7/2004 | Edwards et al. |
| 2006/0039172 A1 | 2/2006 | Soldano |
| 2006/0132105 A1 | 6/2006 | Prasad et al. |
| 2006/0220629 A1 | 10/2006 | Saito et al. |
| 2008/0031014 A1 | 2/2008 | Young |
| 2009/0067206 A1 | 3/2009 | Oguchi et al. |
| 2009/0167432 A1 | 7/2009 | van den Heuvel |
| 2009/0174381 A1 | 7/2009 | Ojanen et al. |
| 2009/0237057 A1 | 9/2009 | Dishman et al. |
| 2009/0256547 A1 | 10/2009 | Akyildiz et al. |
| 2009/0273431 A1 | 11/2009 | Hurst |
| 2009/0302775 A1 | 12/2009 | Alexandrov |
| 2010/0014330 A1 | 1/2010 | Chang et al. |
| 2010/0117715 A1 | 5/2010 | Ariyama |
| 2010/0176755 A1 | 7/2010 | Hoadley et al. |
| 2010/0253309 A1 | 10/2010 | Xi et al. |
| 2011/0241637 A1 | 10/2011 | Parker |
| 2013/0020867 A1 | 1/2013 | Hughes et al. |
| 2013/0021008 A1 | 1/2013 | Hume et al. |
| 2013/0021009 A1 | 1/2013 | Waltman et al. |
| 2013/0021108 A1 | 1/2013 | Hughes |
| 2013/0021702 A1 | 1/2013 | Waltman et al. |
| 2014/0016356 A1 | 1/2014 | Furmanczyk et al. |

FOREIGN PATENT DOCUMENTS

| | | |
|---|---|---|
| JP | 2002-76799 A | 3/2002 |
| JP | 2007-263944 A | 10/2007 |
| JP | 5030216 B2 | 9/2012 |
| KR | 10-2008-0019196 A | 3/2008 |
| KR | 10-2008-0101784 A | 11/2008 |
| WO | 2011/123680 A2 | 10/2011 |
| WO | 2012/116263 A1 | 8/2012 |
| WO | 2014/039982 A1 | 3/2014 |

OTHER PUBLICATIONS eCircuit Center, "Op Amp Input Offset Adjustment," URL=http://www.ecircuitcenter.com/Circuits/op_voff/op_voff2.htm, 2002, 3 pages.

eCircuit Center, "Op Amp Input Offset Voltage," URL=http://www.ecircuitcenter.com/Circuits/op_voff/op_voff.htm, 2002, 3 pages.

International Search Report, mailed Dec. 20, 2013, for PCT/US2013/058784, 3 pages.

Written Opinion, mailed Dec. 20, 2013, for PCT/US2013/058784, 4 pages.

"Application Guide: Theory of Operation," MicroPower Direct, URL=http://micropowerdirect.com/PDF%20Files/Application%20Notes/Power%20Supply%20Theory%20of%20Operation.pdf, download date Apr. 18, 2012, 6 pages.

"Buck converter," URL=http://en.wikipedia.org/wiki/Buck_converter, download date Jun. 23, 2011, 14 pages.

"Maximum Flexible Power (MFP) Single Output Point of Load: Technical Preview-3-6 VDC IN, 7 AMP, Non-Isolated DC/DC Converter," Crane Aerospace & Electronics Power Solutions, 2010, 17 pages.

"Step-gap "E" core swing chokes: Improved regulation and higher efficiency are possible when operating at minimum current levels," Technical Bulletin: Bulletin FC-S4, Magnetics Division, Spang & Company, Butler, Pennsylvania, 2001, 4 pages.

"Synchronous Rectification Aids Low-Voltage Power Supplies," Maxim Integrated Products, URL=http://www.maxim-ic.com/app-notes/index.mvp/id/652, download date Jun. 22, 2011, 6 pages.

Hughes, "Oscillator Apparatus and Method With Wide Adjustable Frequency Range," Office Action mailed Jun. 5, 2013, for U.S. Appl. No. 13/185,152, 17 pages.

Hughes, "Oscillator Apparatus and Method With Wide Adjustable Frequency Range," Amendment filed Oct. 7, 2013, for U.S. Appl. No. 13/185,152, 15 pages.

Hughes, "Oscillator Apparatus and Method With Wide Adjustable Frequency Range," Office Action mailed Jan. 28, 2014, for U.S. Appl. No. 13/185,152, 15 pages.

Hughes et al., "Self Synchronizing Power Converter Apparatus and Method Suitable for Auxiliary Bias for Dynamic Load Applications," Notice of Allowance mailed May 14, 2014, for U.S. Appl. No. 13/185,217, 10 pages.

Hume et al., "Power Converter Apparatus and Method With Compensation for Light Load Conditions," Office Action mailed Nov. 6, 2013, for U.S. Appl. No. 13/185,142, 11 pages.

International Search Report, mailed Oct. 14, 2011, for PCT/US2011/030778, 3 pages.

Kristjansson et al., "Solutions to Today's Low Voltage Power Design Challenges Using High-Efficiency, Non-Isolated Point of Load Converters: A Discussion of the Interpoint™ MFP Series™ Point of Load Converter," Crane Aerospace & Electronics, Power Solutions—Interpoint Products, Redmond, WA, Oct. 2011, Revised Jan. 2012, 25 pages.

Merriam-Webster, "Directly," retrieved from http://www.merriam-webster.com/dictionary/directly, on Nov. 6, 2012, 1 page.

Ng, "Implementing Constant Current Constant Voltage AC Adapter by NCP1200 and NCP4300A," On Semiconductor, Application Note, Publication Order Number: AND8042/D, Feb. 2001, 12 pages.

Parker, "Switched Capacitor Hold-Up Scheme for Constant Boost Output Voltage," Office Action mailed Mar. 28, 2012, for U.S. Appl. No. 12/751,067, 16 pages.

Parker, "Switched Capacitor Hold-Up Scheme for Constant Boost Output Voltage," Amendment filed Jul. 30, 2012, for U.S. Appl. No. 12/751,067, 18 pages.

Parker, "Switched Capacitor Hold-Up Scheme for Constant Boost Output Voltage," Office Action mailed Nov. 16, 2012, for U.S. Appl. No. 12/751,067, 20 pages.

Parker, "Switched Capacitor Hold-Up Scheme for Constant Boost Output Voltage," Amendment filed Jan. 16, 2013, for U.S. Appl. No. 12/751,067, 15 pages.

Parker, "Switched Capacitor Hold-Up Scheme for Constant Boost Output Voltage," Amendment filed Feb. 15, 2013, for U.S. Appl. No. 12/751,067, 15 pages.

Parker, "Switched Capacitor Hold-Up Scheme for Constant Boost Output Voltage," Office Action mailed Jul. 30, 2013, for U.S. Appl. No. 12/751,067, 18 pages.

Parker, "Switched Capacitor Hold-Up Scheme for Constant Boost Output Voltage," Amendment filed Oct. 30, 2013, for U.S. Appl. No. 12/751,067, 19 pages.

(56) References Cited

OTHER PUBLICATIONS

Parker, "Switched Capacitor Hold-Up Scheme for Constant Boost Output Voltage," Notice of Allowance mailed Feb. 3, 2014, for U.S. Appl. No. 12/751,067, 11 pages.

Pascu, "Error Amplifier with Forced Equilibrium Adaptor," Kepco, Inc., retrieved from http://www.kepcopower.com/equibm2.htm#fig2, dated May 22, 2014, 8 pages.

Waltman et al., "Power Converter Apparatus and Method With Compensation for Current Limit/Current Share Operation," Office Action mailed Dec. 17, 2013, for U.S. Appl. No. 13/185,172, 15 pages.

Waltman et al., "Power Converter Apparatus and Method With Compensation for Current Limit/Current Share Operation," Amendment filed Mar. 17, 2014, for U.S. Appl. No. 13/185,172, 16 pages.

Waltman et al., "Power Converter Apparatus and Method With Compensation for Current Limit/Current Share Operation," Notice of Allowance mailed May 8, 2014, for U.S. Appl. No. 13/185,172, 10 pages.

Waltman et al., "Power Converter Apparatus and Methods," U.S. Appl. No. 61/508,937, filed Jul. 18, 2011, 139 pages.

Written Opinion, mailed Oct. 14, 2011, for PCT/US2011/030778, 5 pages.

\* cited by examiner

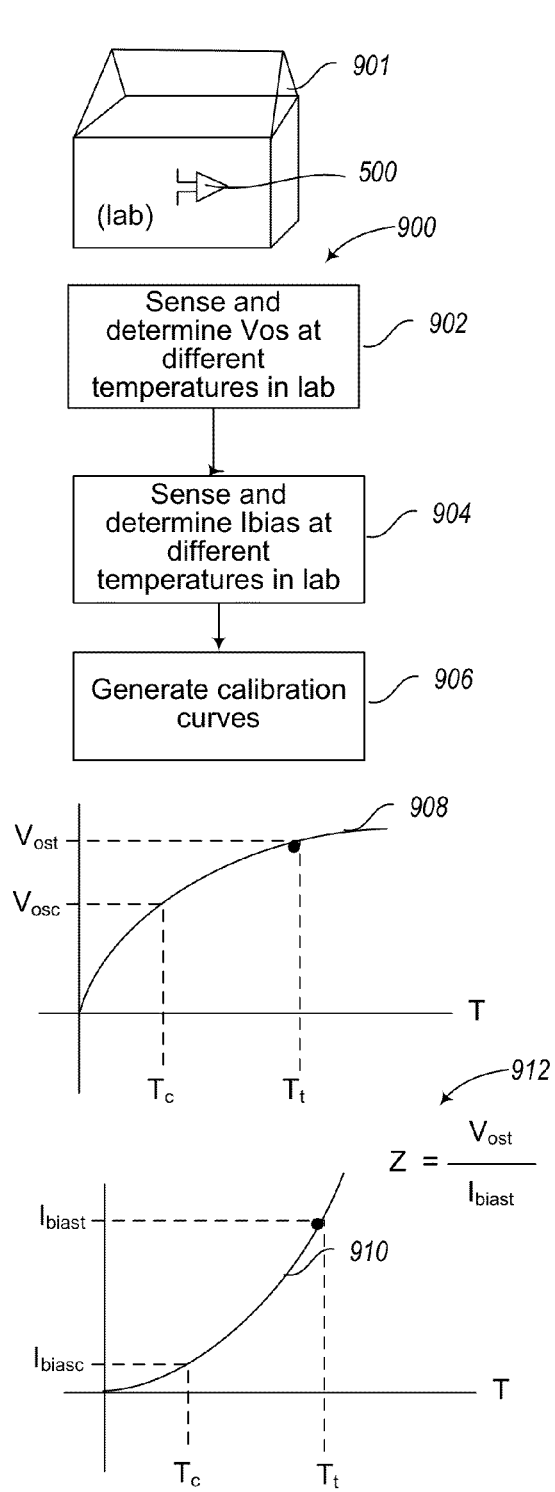
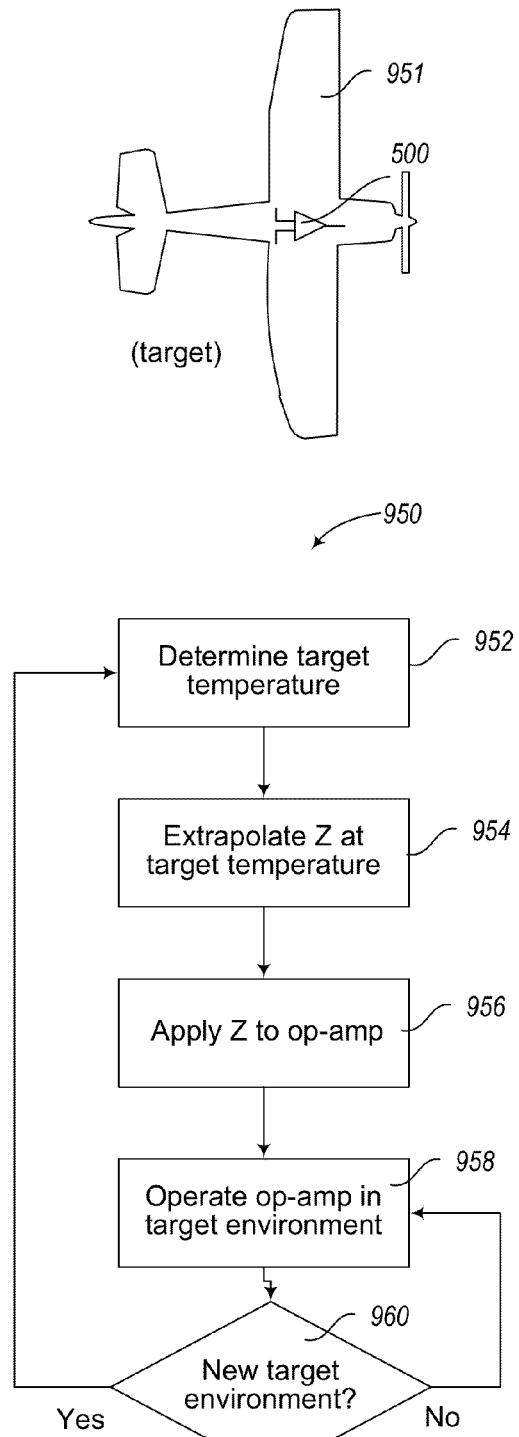
FIG. 9A  FIG. 9B

IMPEDANCE COMPENSATION FOR OPERATIONAL AMPLIFIERS USED IN VARIABLE ENVIRONMENTS

BACKGROUND

1. Technical Field

The present disclosure generally relates to operational amplifiers used in electrical and electronic circuitry and, in particular, to ways of adjusting operational amplifiers to compensate for variations in performance that arise in certain environments.

2. Description of the Related Art

Operational amplifiers ("op-amps") are general purpose differential voltage amplifiers commonly used in electric circuits for many different applications. For example, op-amps are frequently used as building blocks in audio systems that involve complex signal processing circuitry to amplify sound. An idealized op-amp 100, shown in FIG. 1A, is a three-terminal device that has two input terminals, $V^+$ (a non-inverting input), $V^-$ (an inverting input), and one output terminal, $V_{out}$. (Additional terminals are provided to connect a power source (e.g., battery) at $V_s^+$ and $V_s^-$). The differential input voltage to be amplified is $\Delta V = V^+ - V^-$. Components internal to the idealized op-amp 100 cause the differential input voltage $\Delta V$ to appear at the output terminal, multiplied by an amplification factor, or gain, so that $V_{out} = A\Delta V$. Amplification factors for op-amps can be in the range of about 1000-100,000. This characteristic makes op-amps suitable to be used as sensors in many applications in which changes in a small signal can be exaggerated so the changes are easier to monitor and detect.

If a fixed reference voltage $V_{ref}$ is applied to the non-inverting input, the op-amp acts as a comparator device 150, shown in FIG. 1B, that compares an input voltage at the inverting input$^-$ to $V_{ref}$. If the input voltage $V_{in}$ is about equal to $V_{ref}$, the amplified output $V_{out}$ remains small. As $V_{in}$ deviates slightly from $V_{ref}$, the deviation is amplified so that $V_{out}$ becomes very large and can serve as a trigger signal to a downstream device.

One way to test the accuracy of an op-amp used as a sensor or a comparator is to deliberately set the differential input voltage $\Delta V$ to zero (for example, by connecting the two inputs together, or grounding both of the inputs), and verifying that $V_{out}$ is also zero. However, intrinsic errors in the various internal components of the op-amp can compound and cause a detectable zero error referred to as an input offset voltage $V_{os}$. If a non-zero potential $V_{os}$ exists across the two inputs, $V_{os}$ itself can be amplified, producing a significant erroneous non-zero voltage at the output. The zero error associated with an op-amp can be thought of as analogous to the zero error associated with a scale, which is evident when the scale registers a non-zero weight prior to an object being placed on the scale. Scales typically come equipped with mechanical zeroing adjustments to correct these zero errors. In a similar fashion, the input offset voltage $V_{os}$ of an op-amp can be corrected, or nullified, by electrically coupling an "offset null" stage to the $V_-$ input of the op-amp.

FIG. 2 shows one example of an existing voltage-compensated op-amp 200 in which a conventional op-amp 202 that exhibits an input offset voltage $V_{os}$ features such an offset null stage 204. In this example, the offset null stage is in the form of a voltage source $V_{null}$ that effectively zeroes out the erroneous input offset voltage. The input offset voltage $V_{os}$ to be nullified is typically within the range of about a microvolt ($\mu$V) to about a millivolt (mV). The offset null stage 204 can take other forms, such as, for example, one or more of a fixed resistor, variable resistor, potentiometer, current source, or thyristor. If the input offset voltage $V_{os}$ is known to be constant, an offset null having a constant resistance (e.g., a fixed resistor or a network of fixed resistors) can be applied. If the input offset voltage $V_{os}$ fluctuates, causing a $\Delta V_{os}$, an offset null including an adjustable resistance, or a potentiometer, can be applied. The offset null can be applied at one or both of the inputs to the op-amp, or the offset null can be provided as a built-in offset null stage that is internal to the op-amp.

FIG. 3 shows another embodiment of a voltage-compensated op-amp 300, in which a conventional op-amp 302 (with its internal components shown), that exhibits an input offset voltage, is provided with a built-in offset null stage 304.

With reference to FIG. 4, a conventional op-amp 400 is shown in which there exists a difference between the currents at the two inputs, $I_+$ and $I_-$, referred to as an input offset current, $I_{offset} = |I_+ - I_-|$. The average of the two input input currents is referred to as an input bias current: $I_{bias} = (I_+ + I_-)/2$. In an ideal op-amp, the input resistance is so high that the input currents $I_+$ and $I_-$ are both negligible, and therefore $I_{bias} = 0$. Any current appearing at the input terminals of the op-amp 400 is then a small leakage current which is negligible in most applications, even those in which attention is paid to cancelling an input offset voltage. Input bias currents typically range from about a micro-amp to as small as a pico-amp. In some applications, however, a nonzero input bias current $I_{bias}$ brings about another environmentally-dependent, fluctuating source of error, $\Delta I_{bias}$, that warrants cancellation. Therefore, when an input bias current is present, use of an offset null stage to simply cancel $V_{os}$ (or $\Delta V_{os}$) may be insufficient. An input bias current can be nullified by addition of resistors to the circuit, for which the resistor values are preferably carefully selected to precisely cancel the bias current without otherwise affecting circuit performance.

BRIEF SUMMARY

Fluctuations in either the input offset voltage $\Delta V_{os}$ or in the input bias current $\Delta I_{bias}$, or both, can be caused by changes in environmental conditions such as, for example, temperature variation. These drifts in $V_{os}$ and $I_{bias}$ occur because material properties of electronic components internal to the op-amp (e.g., resistivity, mobility) are, in general, temperature-dependent properties. In consideration of these and other environmentally-dependent characteristics, the input offset voltage and the input bias current of an op-amp generally may vary depending on the operational environment of the amplifier. In most applications a temperature-induced drift may not be problematic because op-amps located inside electronic equipment are typically maintained at a moderate temperature that is close to room temperature, or at least in a controlled temperature environment. However, if the op-amp is to be used in vehicles, aircraft, spacecraft, ships, submarines, and the like, or if the op-amp is expected to function according to military and/or environmental specifications that generally include extreme temperatures or widely varying temperature or radiation conditions, it may be necessary to address the question of how best to control or adjust environmentally-dependent intrinsic errors, or to find an alternative way to correct them.

One way to avoid the effects of both $\Delta I_{bias}$ and $\Delta V_{os}$ is to increase the signal level to be so high that changes in the input bias current and the input offset voltage have less impact on the circuit performance. However, this approach can cause unnecessarily high stresses within the circuit and can lead to an excessive amount of electrical power dissipation. Another solution is to balance the impedance at each input (e.g., $R^+$ and R− in FIG. 4), which can compensate for $I_{bias}$, but does not address $\Delta V_{os}$. Other solutions that employ thermistors having an exaggerated temperature dependence to reduce temperature sensitivity fail to address radiation effects. Furthermore, in many applications, such as in a space environment, or in a vacuum chamber, for example, radiation effects may be non-negligible. Nevertheless, designers may fail to consider effects from other ambient energy sources such as high-energy electromagnetic radiation, or other sources of ionizing radiation encountered in the presence of ionized particles.

An operational amplifier that exhibits a variable input offset voltage and a variable input bias current that can arise due to fluctuations in temperature and other ambient energy levels can be corrected for both sources of error by using a dual compensation impedance that is a function of both $V_{os}$ and $I_{bias}$. The dual compensation impedance can take the form of, for example, one or more resistors, potentiometers, thyristors, current sources, and voltage sources, or combinations of these. Various methods of determining $V_{os}$ and $I_{bias}$ provide ways to either offset or compensate for these errors in anticipation of operating the op-amp in different target environments that may subject the device to extreme or fluctuating environmental conditions.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn are not intended to convey any information regarding the actual shape of the particular elements, and have been solely selected for ease of recognition in the drawings.

FIGS. 9A and 9B illustrate a method of variable impedance compensation for fluctuations in anticipated ambient energy levels affecting a target environment according to another illustrated embodiment that entails use of calibration data.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with operational amplifiers and associated circuits have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The headings and Abstract of the Disclosure provided herein are for convenience only and do not interpret the scope or meaning of the embodiments.

Figure 1A:
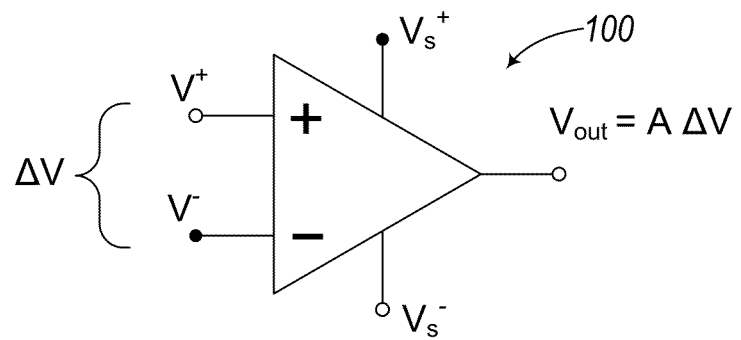
FIGS. 1A and 1B are schematic diagrams of a generic op-amp (differential amplifier) and a conventional comparator, respectively.
Figure 1B:
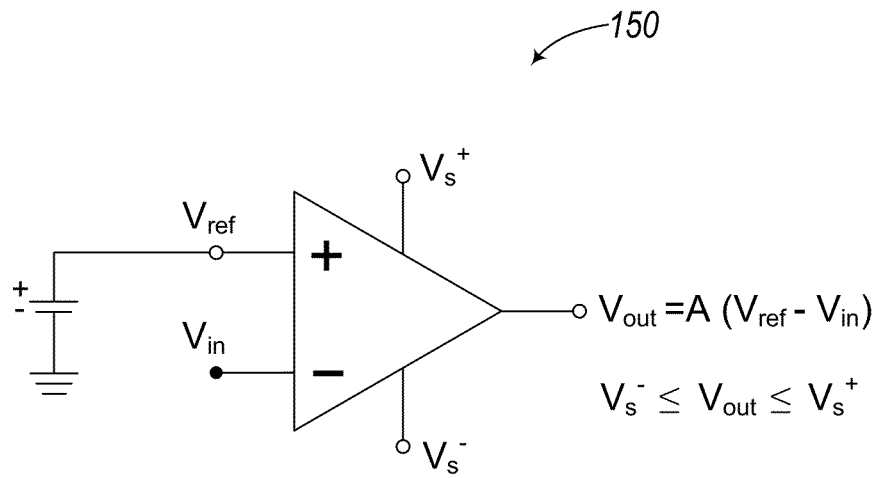
Figure 2:
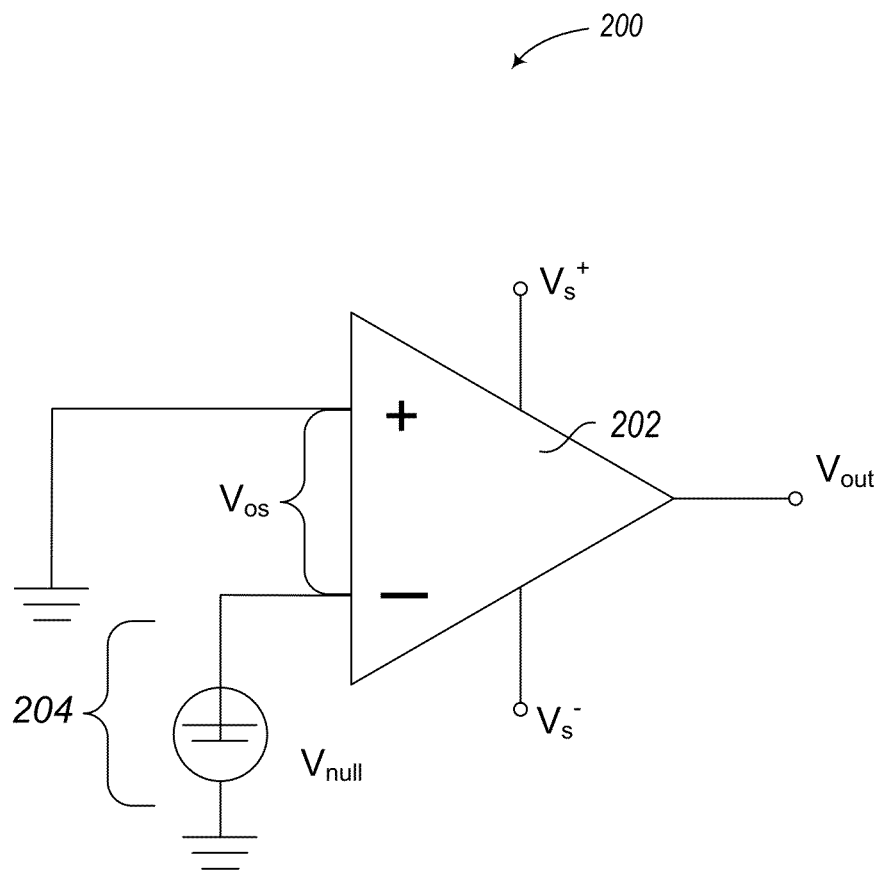
FIG. 2 is a schematic diagram of a conventional op-amp that exhibits an input offset voltage, to which an external offset null correction is applied.
Figure 3:
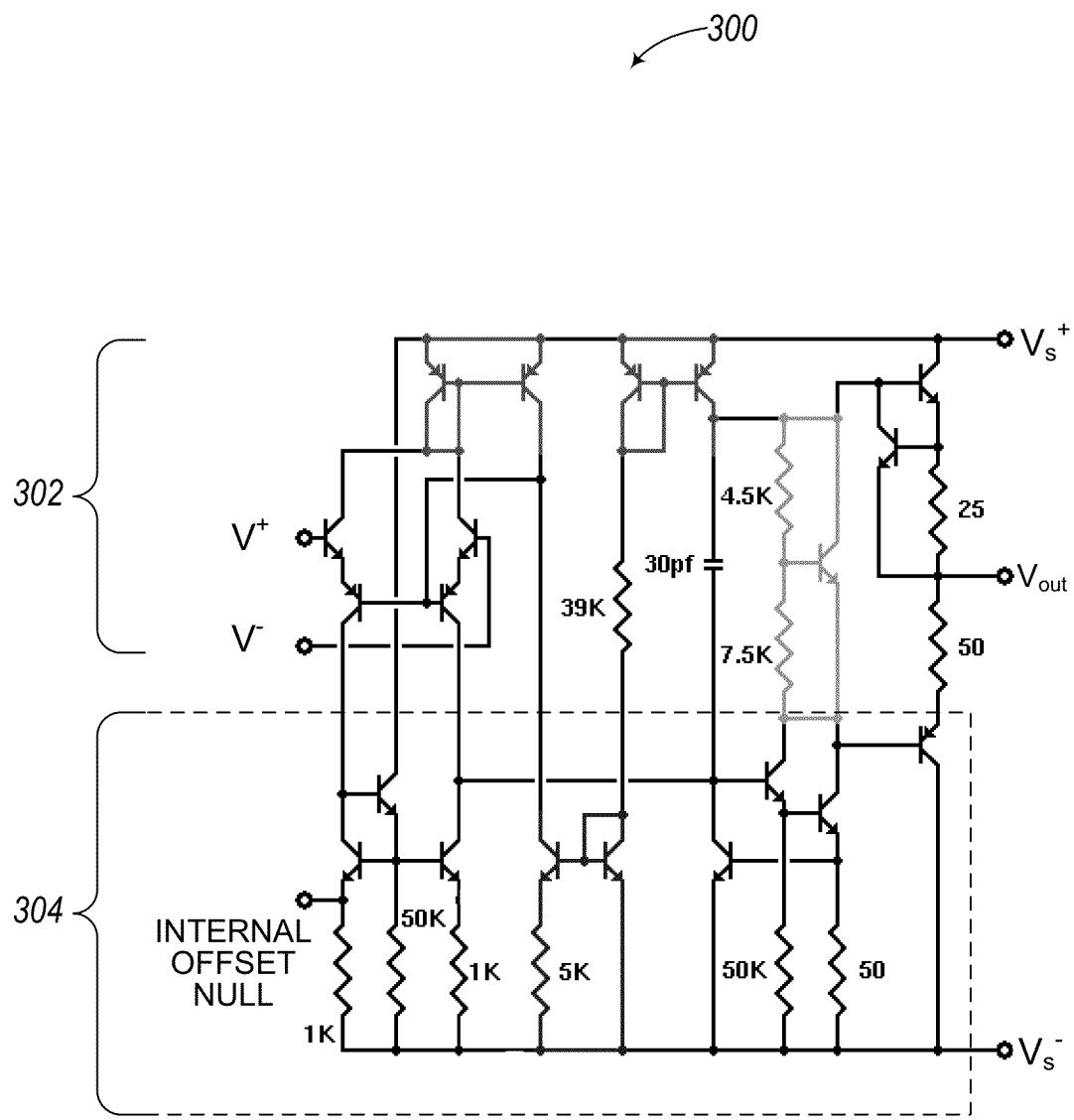
FIG. 3 is a schematic diagram of a conventional op-amp, showing its internal components, that exhibits an input offset voltage, to which a built-in offset null correction is applied.
Figure 4:
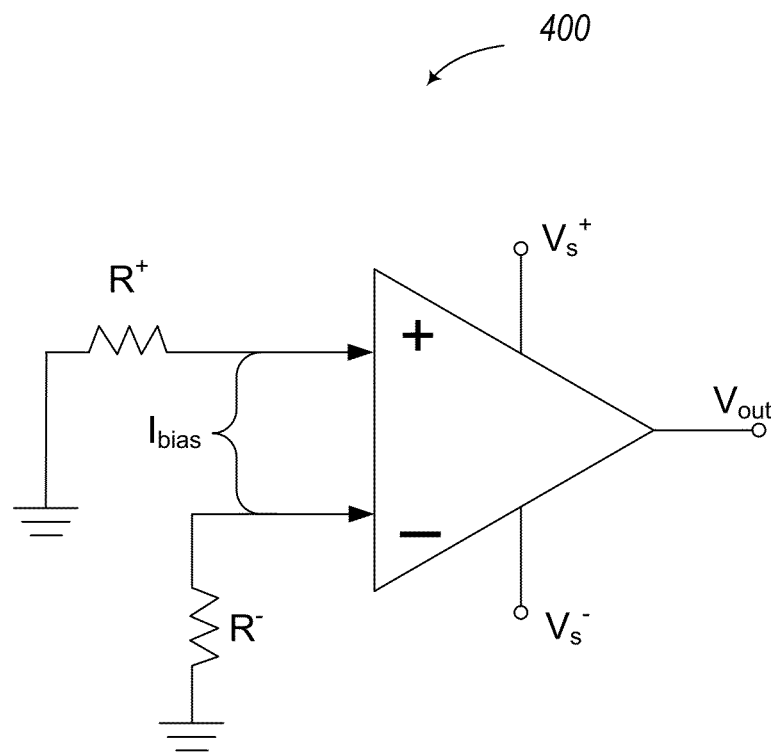
FIG. 4 is a schematic diagram of a conventional op-amp that exhibits an input bias current.
Figure 5:
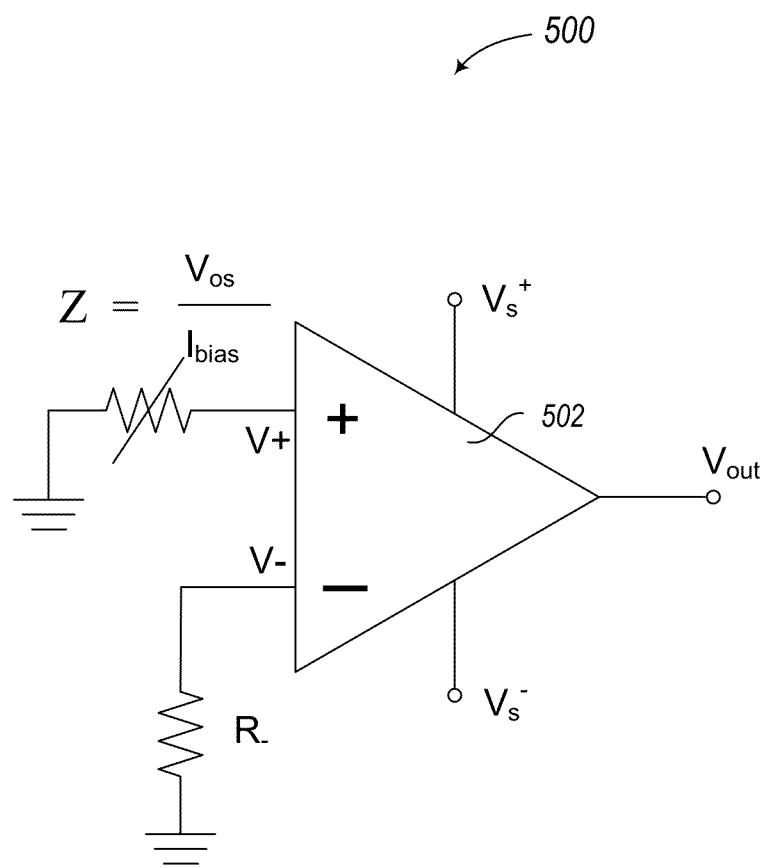
FIG. 5 is a schematic diagram of an op-amp that exhibits an environmentally-induced input offset voltage and an environmentally-induced input bias current, to which a dual compensation impedance stage is applied as taught herein.

With reference to FIG. 5, a dual-compensated op-amp 500 addresses environmental sensitivities within a conventional op-amp 502. The conventional op-amp 502 represents a device that exhibits both types of intrinsic error, $V_{os}$ and $I_{bias}$, and the dual-compensated op-amp 500 simultaneously compensates for both the input bias current and the input offset voltage. The dual compensated op-amp 500 introduces a dual compensation impedance stage in which a dual compensation impedance Z is generally set to be about equal to an input impedance that is a function of both $V_{os}$ and $I_{bias}$. For example, if the input impedance is the ratio of $V_{os}/I_{bias}$ the dual compensation impedance Z can be set about equal to this ratio to offset the input impedance. Alternatively, the dual compensation impedance Z may be otherwise related to $V_{os}$ and $I_{bias}$ or to their ratio. Furthermore, an environmental effect that causes a change $\Delta V_{os}$ in the input offset voltage will also tend to cause a commensurate change $\Delta I_{bias}$ in the input bias current, and both changes can be taken into account by applying a variable dual compensation impedance $\Delta Z = \Delta V_{os}/\Delta I_{bias}$ to the non-inverting input of the dual-compensated op-amp 500. For example, if a temperature change causes $V_{os}$ to increase by a factor of 2, $I_{bias}$ may also increase by a factor of 2, in which case the effects cancel out and the variable dual compensation impedance $\Delta Z$ does not change. Instead of engaging in the usual practice of balancing both input currents to the op-amp, providing the dual compensation impedance $Z \pm \Delta Z$ at one of the inputs creates an imbalance that simultaneously compensates for both inherent sources of error, as well as for environmentally-induced variations in the error.

Figure 6:
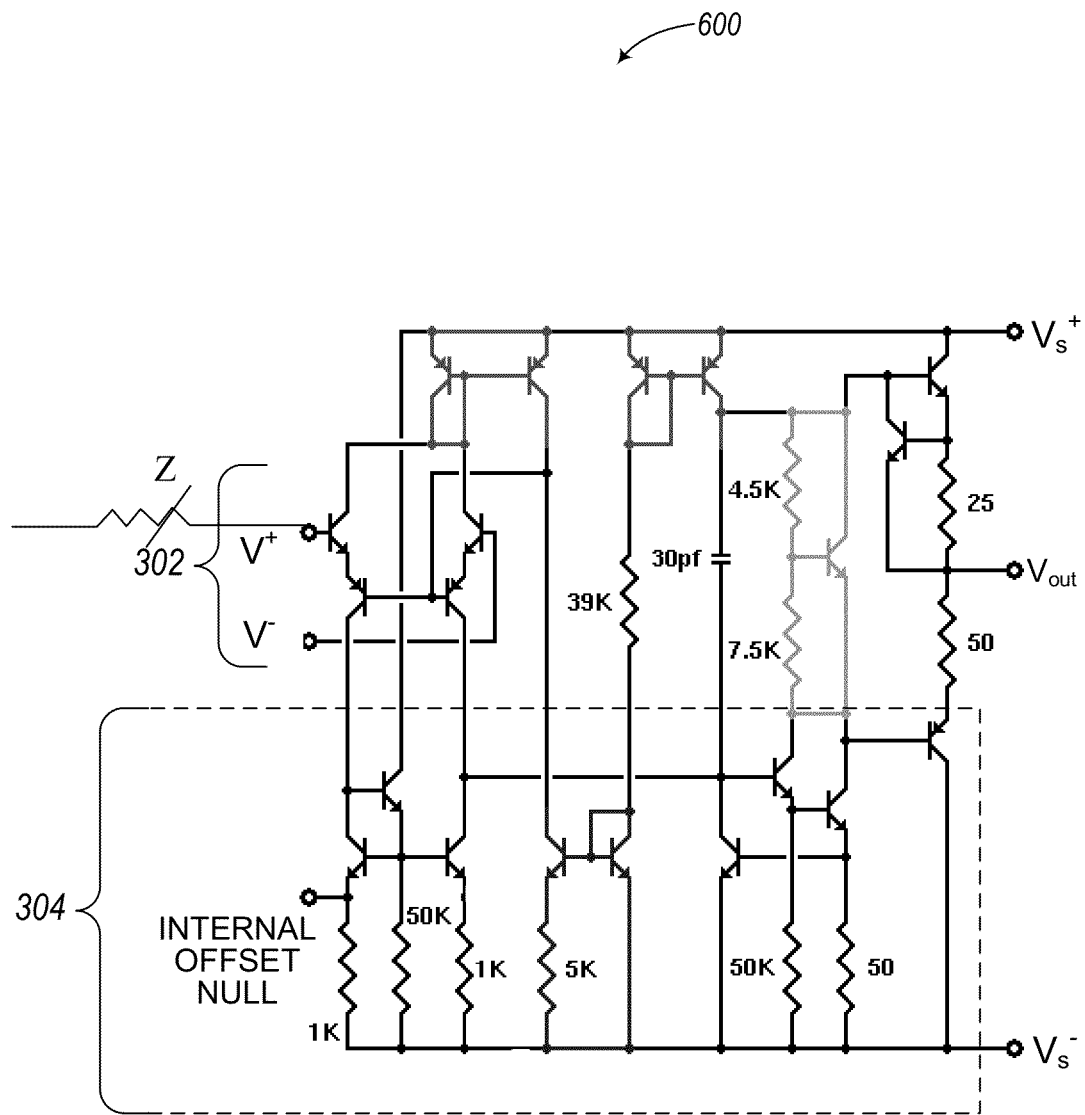
FIG. 6 is a schematic diagram of a dual-compensated op-amp, showing its internal components, that exhibits an input offset voltage for which a built-in offset null correction is applied, and an input bias current for which a compensation impedance is applied.

With reference to FIG. 6, in one embodiment, a partially compensated op-amp 600 includes a dual compensation impedance stage applied to the non-inverting input $V_+$ of the op-amp 302, which already includes the internal offset null 304 to compensate for $V_{os}$. In this case, the dual compensation impedance Z can be adjusted to compensate only for $I_{bias}$ or to provide additional offset voltage compensation if the internal offset null 304 turns out to be insufficient. For each of the dual-compensated op-amp 500 and the partially-compensated op-amp 600, a dual compensation impedance stage may take the form of a single resistance or the dual compensation impedance may include one or more resistive components such as resistors, thyristors, thermistors, resistor networks, variable resistors, potentiometers, and the like. The dual compensation impedance stage may also be built into the partially-compensated op-amp 600.

Figure 7:
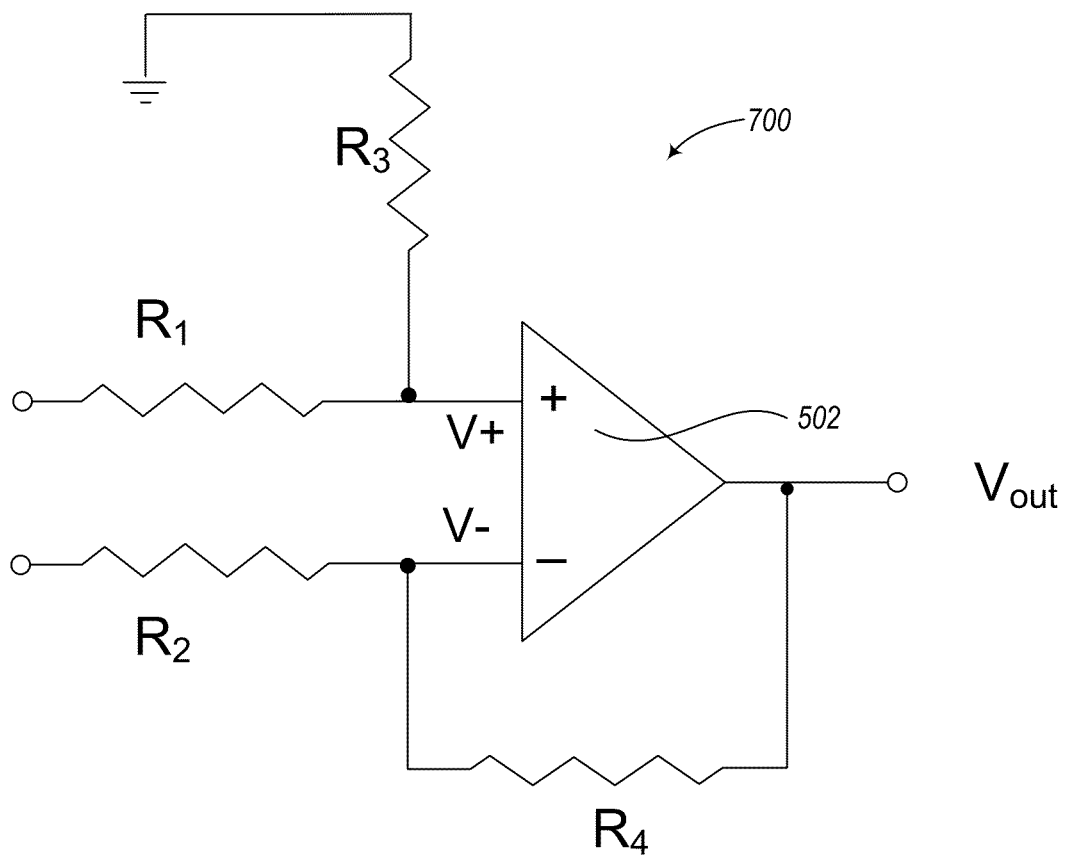
FIG. 7 is a schematic diagram of an op-amp that exhibits an environmentally-induced input offset voltage and an environmentally-induced input bias current, to which a network of resistors is applied as an unbalanced dual compensation impedance stage.

With reference to FIG. 7, in one embodiment of a dual-compensated op-amp 700, a dual compensation impedance stage can be applied to the op-amp 502, as a network of resistances selectively electrically coupled to the non-inverting input terminal $V^+$ the inverting input terminal $V^-$, the output terminal, $V_{out}$, or combinations thereof. For example, the dual compensation impedance Z can be applied to correct the op-amp 502 by electrically coupling a second resistance $R_2$ at the inverting terminal $V^-$, providing a third resistance $R_3$ electrically coupled between the positive input terminal and a ground, and providing a fourth resistance $R_4$ electrically coupled between the inverting input terminal $V^-$ and the output terminal $V_{out}$, or combinations of these.

Various embodiments of the compensated op-amps 500, 600, and 700 can further be distinguished by differences in methods of providing an accurate and useful value of the dual compensation impedance Z, that is derived from values of $V_{os}$ and $I_{bias}$. To adjust the dual compensation impedance Z, values of $V_{os}$ and $I_{bias}$ are needed, which can be obtained from sensors, calculations, or extrapolations, or combinations of these. Moreover, in a fluctuating energy environment, or in a remote environment, the dual compensation impedance Z may need to be updated periodically. For example, a value for the dual compensation impedance Z can be set while the op-amp is in a laboratory, manufacturing facility, or other calibration environment, after which the op-amp can be installed in a vehicle and sent to its intended target operational environment. Or, determination of the dual compensation impedance Z can be made in-situ, in the target environment, based on either direct measurements or sensing environmental parameters and extrapolating the necessary compensation.

Figure 8:
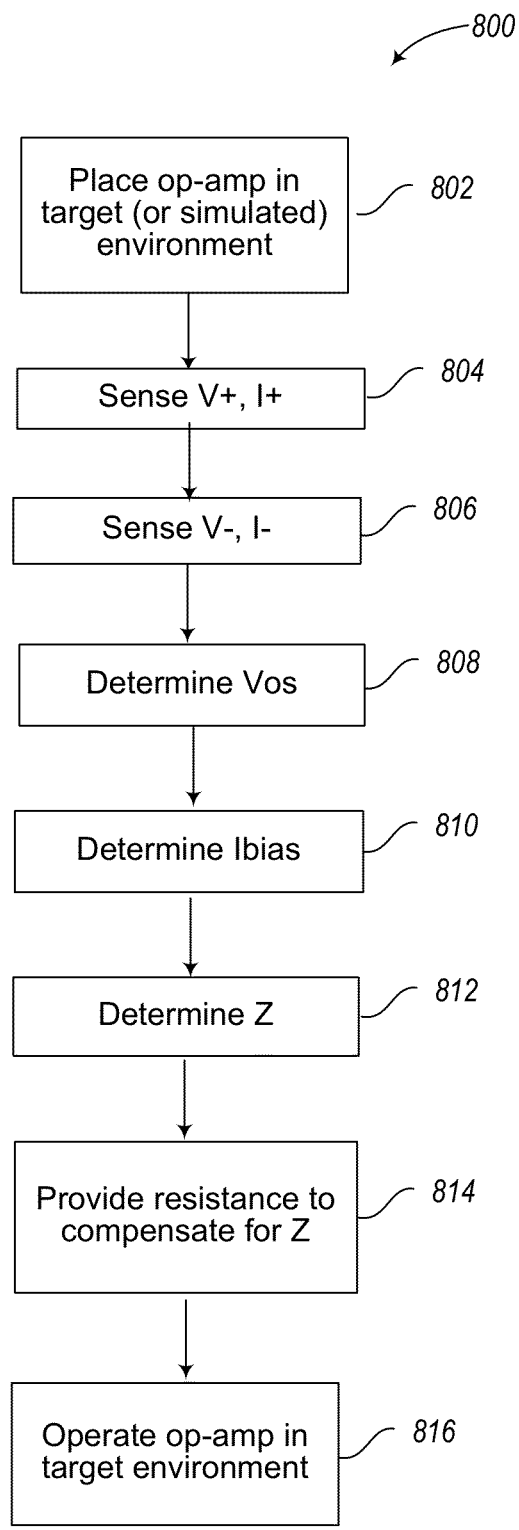
FIG. 8 is a flow diagram showing a method of variable impedance compensation for fluctuations in ambient energy levels affecting an op-amp according to one illustrated embodiment.

In one scenario, described in FIG. 8, the dual compensation impedance Z can be set so as to cancel out $V_{os}$ and $I_{bias}$ as closely as possible according to a method 800 in which actual zero measurements of a particular op-amp are made either in the target environment or in a simulated target environment (802). This can be done after the device reaches a remote target operational environment, or, the op-amp can be configured in a simulated target environment. The target environment may or may not be the laboratory calibration environment itself, or an equivalent ground-based environment. At 804, electrical characteristics (voltages and currents) of the op-amp can be sensed so that $V_{os}$ can be determined at 808. For example, $V_{os}$ can be determined by connecting the two input terminals $V^+$ and $V^-$ together, measuring $V_{out}$, and dividing by the known gain factor A. Then $I_{bias}$ can be determined at 810 by measuring leakage currents $I^+$ and $I^-$ at the two input terminals under operation of the op-amp, and calculating their difference. Finally, the dual compensation impedance Z can be determined at 812 by taking the ratio of $V_{os}$ to $I_{bias}$ so that the op-amp can then be configured with a compensation resistance, and supplied to a customer with the impedance correction already in place. The dual compensation impedance Z is then applied to the op-amp at 814, and the device is then ready to operate in its target environment at 816. If the op-amp has been configured in an environment that simulates remote conditions, the op-amp can first be transported to its target environment before being switched on for operation.

According to one embodiment illustrated in FIGS. 9A and 9B, the dual compensation impedance Z can be deliberately set to compensate for one or both sources of error ($V_{os}$ and $I_{bias}$), at an anticipated level. For example, if an op-amp is to be used in an avionics system on-board an aircraft that is operable in a target environment having a known extreme temperature T, the value of the dual compensation impedance Z can be estimated ahead of time to cancel effects of the anticipated future ambient temperature T, instead of being set to cancel effects due to the local ambient temperature of the present environment. As shown in FIGS. 9A and 9B, this can be done by generating a set of calibration curves for each device at a lab or manufacturing facility prior to distributing devices to customers. For example, a calibration method 900 can be carried out in a calibration environment (e.g., lab) 901 to generate calibration curves 908 and 910. The calibration curves 908 and 910 can later be used to extrapolate predictions for an impedance setting 912 that conforms to conditions in a remote target environment 951 (e.g., an airplane flying at a certain altitude). A particular op-amp can be measured first in the calibration environment 901 to determine values of the input offset voltage $V_{osc}$ (902) and the input bias current $I_{biasc}$ (904) at a lab temperature $T_c$. Then at 902 and 904, the temperature in the calibration environment can be changed and successive measurements of $V_{os}$ and $I_{bias}$ can be made to generate (906) the $V_{os}$ calibration curve 908 and the $I_{bias}$ calibration curve 910, respectively, as a function of temperature, T. Finally, for a known target environment 951 having a known temperature $T_t$, a prediction for the correct value of the dual compensation impedance Z for use in the target environment 951 can be obtained by calculating the ratio $V_{ost}/I_{biast}$ using error values indicated on the calibration curves 908 and 910 at the known temperature $T_t$, and the op-amp can be set accordingly. The set of curves 908 and 910 can be stored for future reference in a non-transitory storage medium such as an electronic memory for future reference, and the calibration data may be provided to a customer along with the device. Instead of, or in addition to, generating the temperature-based calibration curves 908 and 910, other sets of curves can be generated by varying other environmental conditions such as ambient radiation levels.

A method 950, illustrated in FIG. 9B, can be used to update the setting for the dual compensation impedance Z if the target environment changes. At 952, a new target temperature can determined, e.g., by an in-situ measurement or from known characteristics of a new operational destination. At 954, a value of the dual compensation impedance Z is determined from the existing calibration curves 908 and 910 as described above. At 956, the new value of the dual compensation impedance Z is applied to the op-amp in the new target environment, and operation continues at 958 until the target environment changes again at 960, thus triggering a repeat of the method 950. At 954, extrapolating the dual compensation impedance Z can be executed semi-automatically using one or more processors to extract values from the calibration curves, or from calibration tables derived from the calibration curves, and perform the determination of the dual compensation impedance Z electronically.

Figure 10A:
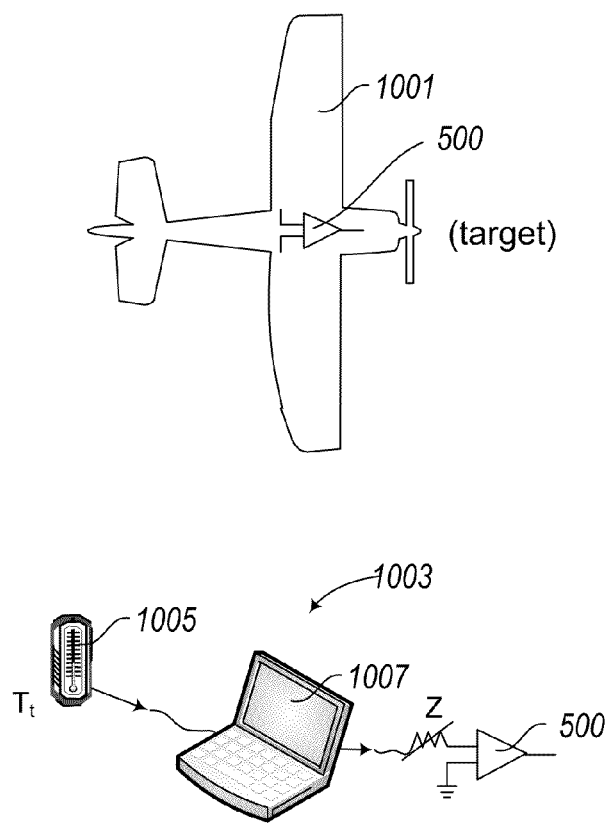
FIGS. 10A and 10B illustrate a method of variable impedance compensation for fluctuations in ambient energy levels during operation in a target environment, according to another illustrated embodiment that entails use of a sensor in combination with calibration data.
Figure 10B:
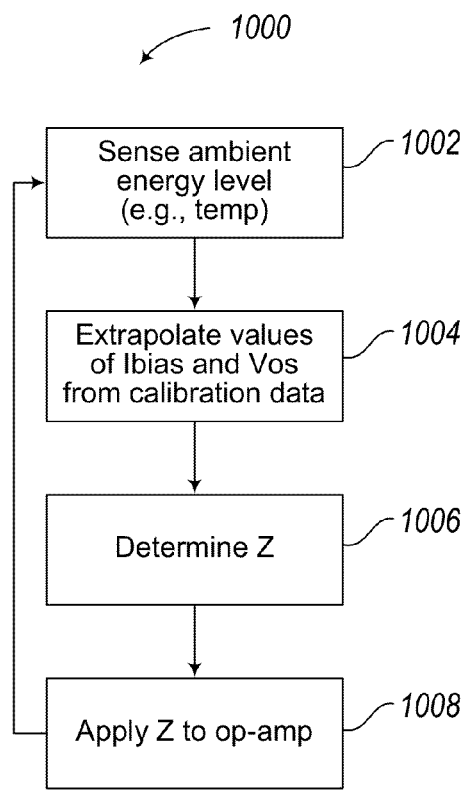

Alternatively, an exemplary feedback control method 1000 can be used to maintain the dual compensation impedance Z at an accurate value throughout operation of the op-amp in a changing target environment 1001, as illustrated in FIGS. 10A and 10B. In this embodiment, the dual compensation impedance Z can be set automatically, in-situ, using an exemplary feedback control system 1003 located within the target environment 1001. Using the method 1000, the dual compensation impedance Z is adjusted according to measurements of fluctuating ambient conditions in the target environment 1001 such as temperature and radiation. The exemplary feedback control system 1003 includes one or more energy level sensors 1005 that provide signals indicative of an ambient energy level in the target environment. The feedback control system 1003 also includes one or more computing devices 1007 that include at least a processor and a non-transitory storage medium such as an electronic memory. At 1002, the sensor(s) 1005 are used to capture information (e.g., temperature) characterizing a particular ambient environment. The sensed information can then be used at 1004 and 1006 to computationally determine an appropriate value of the dual compensation impedance Z by calculation, look-up tables, or other methods. For example, the calibration curves 908 and 910 described above can be saved in the electronic computer memory within the computing device 1007. Thus, when the op-amp 500 enters its destination environment, a temperature measurement can be obtained by the sensor 1005, the error values $V_{ost}$ and $I_{biast}$ can be extrapolated at 1004 from the saved calibration curves, and an input impedance value can be calculated accordingly at 1006. The dual compensation impedance Z can then be applied to offset the input impedance at 1008, for use until another temperature measurement becomes available, or until the temperature shifts, requiring the dual compensation impedance Z to be updated again.

The feedback control method 1000 can be implemented as an automated method by using a processor-based system 1003, in which the determination of the dual compensation impedance Z is made according to programmed instructions and the resulting dual compensation impedance Z adjustment is applied directly to the op-amp in response to an output signal from the processor-based system 1003. One advantage of this automated feedback control method 1000 is that the procedure can be repeated as many times as needed to ensure that the dual compensation impedance Z remains optimally tuned to the present environment as the environment changes. A second advantage is that the feedback control method 1000 does not require human intervention. A third advantage is that the feedback control method 1000 is based on actual ambient conditions, instead of relying on an extrapolation of a representative set of calibration data.

Figures 11A, 11B:
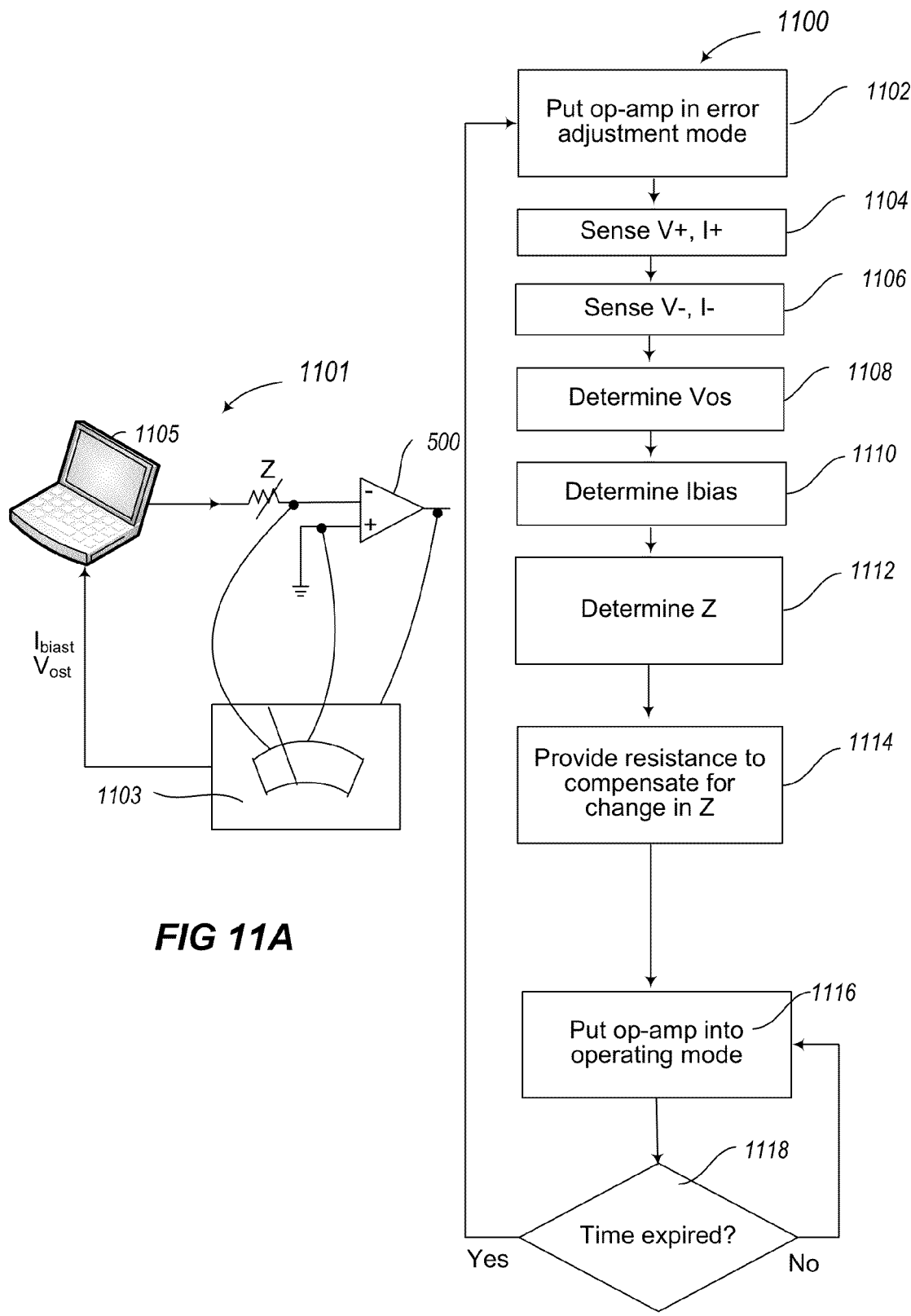
FIGS. 11A and 11B illustrate a method of variable impedance compensation for fluctuations in ambient energy levels during operation in a target environment, according to another illustrated embodiment that entails use of an in-situ sensor apparatus that can periodically adjust the impedance compensation at selected time intervals.

In another embodiment, a periodic in-situ calibration method 1100 can be performed in the target environment at selected time intervals using an in-situ calibration apparatus 1101, as shown in FIGS. 11A and 11B. An exemplary in-situ calibration apparatus 1101 can include an electronic multimeter 1103, and a computing device 1105 for collecting signals from and applying signals to the dual-compensated op-amp 500. The calibration apparatus 1101 can take on different forms, for example the calibration apparatus 1101 can be external to the op-amp 500, or the calibration apparatus 1101 can be built into a chip that includes the op-amp 500. According to the in-situ calibration method 1100, at 1102, the dual-compensated op-amp 500 can be temporarily released from its operational mode and placed into an error-adjustment mode for re-calibration. (Alternatively, the value of the dual compensation impedance Z can be adjusted on the fly in response to sensing a drift in op-amp performance.) During re-calibration, the input voltage and input current at the non-inverting input can be sensed at 1104, and the voltage and current at the inverting input can be sensed at 1106. From these measurements, the $V_{os}$ and $I_{bias}$ errors can be determined at 1108 and 1110, respectively, and the input impedance can be determined accordingly at 1112. The dual compensation impedance Z can then be applied at 1114 by providing more or less resistance, for example, at the non-inverting input of the dual-compensated op-amp 500, or by adjusting any of $R_1$, $R_2$, $R_3$, or $R_4$. Once an impedance adjustment has been made at 1114, the op-amp can be placed back in operating mode at 1116 until the decision block 1118 determines that another update is due, according to a clock that shows whether the present time interval has yet expired.

The foregoing detailed description has set forth various embodiments of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of hardware, software, firmware, or virtually any combination thereof. In one embodiment, the present subject matter may be implemented via Application Specific Integrated Circuits (ASICs). However, those skilled in the art will recognize that the embodiments disclosed herein, in whole or in part, can be equivalently implemented in conventional integrated circuits, as one or more computer programs running on one or more computers (e.g., as one or more programs running on one or more computer systems), as one or more programs running on one or more controllers (e.g., microcontrollers) as one or more programs running on one or more processors (e.g., microprocessors), as firmware, or as virtually any combination thereof, and that designing the circuitry and/or writing the code for the software and or firmware would be well within the skill of one of ordinary skill in the art in light of this disclosure.

Those of skill in the art will recognize that many of the methods or algorithms set out herein may employ additional acts, may omit some acts, and/or may execute acts in a different order than specified.

In addition, those skilled in the art will appreciate that the mechanisms taught herein, for example, calibration curves or lookup tables, are capable of being distributed as a program product in a variety of forms, and that an illustrative embodiment applies equally regardless of the particular type of signal bearing media used to actually carry out the distribution. Examples of signal bearing media include, but are not limited to, the following: recordable type media such as floppy disks, hard disk drives, CD ROMs, digital tape, and computer memory.

The various embodiments described above can be combined to provide further embodiments. To the extent that they are not inconsistent with the specific teachings and definitions herein, all of the U.S. patents, U.S. patent application publications, U.S. patent applications, foreign patents, foreign patent applications and non-patent publications referred to in this specification are incorporated herein by reference, in their entirety. Aspects of the embodiments can be modified, if necessary, to employ systems, circuits and concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A circuit for use with an operational amplifier in an environment that experiences fluctuations in ambient energy levels, the operational amplifier including a first input terminal that accepts a first input signal, the first input terminal associated with a first input impedance, a second input terminal that accepts a second input signal, the second input terminal associated with a second input impedance, an output terminal that produces an output signal based on the first and the second input signals, and internal components that generate an input offset voltage and an input bias current, the circuit comprising:
   a compensation impedance stage electrically coupled to at least one of the first input terminal and the second input terminal, the compensation impedance stage having a compensation impedance that is selected proportional to a ratio of a change in the input offset voltage and a change in the input bias current, the compensation impedance compensates for environmentally-induced changes in both the input offset voltage and the input bias current.

2. The circuit of claim 1, further comprising the operational amplifier, wherein the input offset voltage and the input bias current vary in response to the fluctuations in the ambient energy levels.

3. The circuit of claim 2, wherein the compensation impedance stage is an integral unitary portion of the operational amplifier.

4. The circuit of claim 1, wherein the first input terminal is a non-inverting input terminal, and the compensation impedance stage includes an added first resistance electrically coupled to the first input terminal.

5. The circuit of claim 4, wherein the added first resistance includes a potentiometer selectively operable to adjust the compensation impedance of the compensation impedance stage.

6. The circuit of claim 4, wherein the second input terminal is an inverting input terminal, and the compensation impedance stage further includes a second resistance electrically coupled to the second input terminal.

7. The circuit of claim 6, wherein values of the first resistance and the second resistance are unbalanced so as to nullify effects of one or more of the input offset voltage and the input bias current.

8. The circuit of claim 6, wherein the first resistance and the second resistance are unbalanced so as to provide compensation for effects of one or more of input offset voltage and the input bias current.

9. The circuit of claim 6, wherein the compensation impedance stage further includes a ground coupled to the first input terminal and a third resistance electrically coupled between the first input terminal and the ground.

10. The circuit of claim 9, wherein the compensation impedance stage further includes a fourth resistance electrically coupled between the second input terminal and the output terminal.

11. The circuit of claim 1, wherein the operational amplifier further includes an internal offset null, and the compensation impedance of the compensation impedance stage is applied to the first input terminal to compensate for the input bias current.

12. The circuit of claim 1 wherein values of the input offset voltage and the input bias current are determined from measured data while operating the operational amplifier in a target environment or a simulated target environment.

13. The circuit of claim 1 wherein values of the input offset voltage and the input bias current are determined from a set of calibration data stored in a non-transitory storage medium, to compensate for effects of ambient energy levels in an anticipated target environment.

14. The circuit of claim 13, wherein values of the input offset voltage and the input bias current are extrapolated from the calibration data by a logic circuit.

15. The circuit of claim 14, further comprising: one or more energy level sensors, and wherein the logic circuit includes one or more energy level sensors responsive to an ambient energy level in the target environment.

16. The circuit of claim 14, wherein the energy level sensors include one or more of a temperature sensor and a radiation level sensor.

17. The circuit of claim 1, wherein a value of the compensation impedance is determined from data obtained in a simulated target environment.

18. A method of compensation for fluctuations in ambient energy levels affecting an operational amplifier, the operational amplifier including internal components that generate an input offset voltage and an input bias current, the method comprising:
   determining a change in the input offset voltage caused by a change in ambient energy levels;
   determining a change in input bias current caused by a change in ambient energy levels; and
   electrically coupling a compensation impedance stage to at least one input terminal of the operational amplifier, the compensation impedance stage having an impedance selected proportional to a ratio of the determined change in the input offset voltage and the determined change in the input bias current.

19. The method of claim 18 wherein determining the change in the input offset voltage caused by the change in ambient energy levels includes sensing the input offset voltage at two or more ambient energy levels.

20. The method of claim 18 wherein determining the change in the input bias current caused by the change in ambient energy levels includes sensing the input bias current at two or more ambient energy levels.

21. The method of claim 18 wherein determining the change in the input offset voltage caused by the change in ambient energy levels and determining the change in the input bias current caused by the change in ambient energy levels includes operating the operational amplifier in a plurality of ambient energy levels.

22. The method of claim 21, further comprising:
   generating calibration data by, sensing the input offset voltage at the plurality of ambient energy levels;

sensing the input bias current at the plurality of ambient energy levels; and storing the sensed input offset voltages and sensed input bias currents in a nontransitory storage medium.

23. The method of claim 18 wherein electrically coupling a compensation impedance stage to at least one input terminal of the operational amplifier includes electrically coupling at least one fixed resistor to one input terminal of the operational amplifier.

24. A circuit for use with an operational amplifier in an environment that experiences fluctuations in ambient energy levels, the operational amplifier including a first input terminal that accepts a first input signal, the first input terminal associated with a first input impedance, a second input terminal that accepts a second input signal, the second input terminal associated with a second input impedance, an output terminal that produces an output signal based on the first and the second input signals, and internal components that generate an input offset voltage and an input bias current, the circuit comprising:

a compensation impedance stage electrically coupled to at least one of the first input terminal and the second input terminal, the compensation impedance stage having a compensation impedance that is selected as a function of a ratio of a determined change in the input offset voltage due to fluctuations in ambient energy levels and a determined change in the input bias current due to fluctuations in ambient energy levels.

* * * * *